US010692956B2

(12) United States Patent
Choi et al.

(10) Patent No.: US 10,692,956 B2
(45) Date of Patent: *Jun. 23, 2020

(54) DISPLAY DEVICE INCLUDING A CONTROL LINE WITH A DETOUR PART

(71) Applicant: SAMSUNG DISPLAY CO., LTD., Yongin-si, Gyeonggi-Do (KR)

(72) Inventors: Jun Won Choi, Cheonan-si (KR); Chae Han Hyun, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/845,966

(22) Filed: Dec. 18, 2017

(65) Prior Publication Data

US 2018/0212016 A1 Jul. 26, 2018

(30) Foreign Application Priority Data

Jan. 26, 2017 (KR) .......................... 10-2017-0012532

(51) Int. Cl.
*H01L 27/32* (2006.01)
*G09G 3/3258* (2016.01)

(52) U.S. Cl.
CPC ....... *H01L 27/3276* (2013.01); *G09G 3/3258* (2013.01); *H01L 27/3272* (2013.01); *G09G 2300/0426* (2013.01); *G09G 2320/0204* (2013.01); *G09G 2320/0209* (2013.01); *H01L 2251/5392* (2013.01)

(58) Field of Classification Search
CPC ..................... H01L 27/3276; H01L 27/3272
See application file for complete search history.

(56) References Cited

U.S. PATENT DOCUMENTS 10,032,846 B2 * 7/2018 Choi .................... G09G 3/3233
2016/0035811 A1 * 2/2016 Choi .................... H01L 51/5221
257/72

(Continued)

FOREIGN PATENT DOCUMENTS

EP 2980853 A2 2/2016
EP 3255672 A1 12/2017

OTHER PUBLICATIONS

Extended European Search Report dated Jun. 27, 2018 for European Patent Application No. 18151553.7.

*Primary Examiner* — Lex H Malsawma
*Assistant Examiner* — Laura M Dykes
(74) *Attorney, Agent, or Firm* — F. Chau & Associates, LLC

(57) ABSTRACT

A display device includes a scan line extending in a first direction. A plurality of data lines cross the scan line. A driving voltage line crosses the scan line. An active pattern includes a plurality of channel regions and a plurality of conductive regions. A control line is connected to the plurality of data lines and the driving voltage line. The active pattern includes a shielding part overlapping at least one data line of the plurality of data lines. The control line includes a plurality of main line parts each extending in the first direction, and a detour part connecting two adjacent main line parts of the plurality of main line parts to each other. The detour part extends along a periphery of the active pattern and crosses the at least one data line of the plurality of data lines.

19 Claims, 10 Drawing Sheets

(56) References Cited

U.S. PATENT DOCUMENTS

2016/0322442 A1* 11/2016 Lee .................... H01L 27/3262
2016/0380039 A1* 12/2016 Oh ..................... H01L 27/3276
                                                         257/40
2017/0358605 A1* 12/2017 Choi ................... H01L 27/124

* cited by examiner

DISPLAY DEVICE INCLUDING A CONTROL LINE WITH A DETOUR PART

CROSS-REFERENCE TO RELATED APPLICATION

This application claims priority to and the benefit of Korean Patent Application No. 10-2117-0012532 filed in the Korean Intellectual Property Office on Jan. 26, 2017, the entire contents of which are herein incorporated by reference.

TECHNICAL FIELD

The present disclosure relates to a display device, and more particularly, to a display device including an emission layer.

DISCUSSION OF THE RELATED ART

A display device for displaying an image includes a plurality of pixels. Where the display device is an organic light emitting diode (OLED) display device, each of these pixels may include an organic light emitting diode having a cathode, an anode, and an organic emission layer disposed between the cathode and anode. Each organic light emitting diode may further include a plurality of transistors and at least one capacitor for driving the organic light emitting diode.

In the organic light emitting diode, electrons injected from the cathode and holes injected from the anode are combined in the organic emission layer to form an exciton, thereby emitting light as the exciton relaxes.

The plurality of transistors includes at least one switching transistor and a driving transistor. At least one switching element may receive a data signal under the control of a scan signal and may transmit a voltage to the driving transistor. The driving transistor is directly or indirectly connected to the organic light emitting diode to control a level of a current transmitted to the organic light emitting diode, thereby each pixel emits light of a desired luminance.

The capacitor is connected to a driving gate electrode of the driving transistor, thereby maintaining a voltage of the driving gate electrode.

Since the data line transmits a data signal that is changed with respect to time, if a parasitic capacitance is formed between a conductor disposed near the data line and the data line, the change of the data voltage may affect the voltage of the conductor. Particularly, if the voltage of a driving gate node, such as the driving gate electrode of the driving transistor affecting the luminance of the pixel, is changed as a result of the change of the data signal transmitted by the adjacent data line, the luminance of the pixel is changed, thereby causing a display quality defect such as crosstalk.

SUMMARY

A display device includes a scan line extending in a first direction. A plurality of data lines cross the scan line. A driving voltage line crosses the scan line. An active pattern includes a plurality of channel regions and a plurality of conductive regions. A control line is connected to the plurality of data lines and the driving voltage line. The active pattern includes a shielding part overlapping at least one data line of the plurality of data lines. The control line includes a plurality of main line parts each extending in the first direction, and a detour part connecting two adjacent main line parts of the plurality of main line parts to each other. The detour part extends along a periphery of the active pattern and crosses the at least one data line of the plurality of data lines.

A display device includes a plurality of pixels. Each pixel includes a light emitting diode. A sixth transistor is connected to the light emitting diode. A control line includes a gate electrode of the sixth transistor. A data line crosses the control line. A shielding part overlaps the data line and receives a driving voltage. The control line further includes a main line part that does not cross the data line. The control line further includes a detour part connected to the main line part and bent along a periphery of the shielding part.

An organic light emitting diode display device includes a first pixel having a data line connected thereto with a first plurality of transistors having an active pattern. A second pixel has a second plurality of transistors and a control line configured to supply a control signal to the second plurality of transistors. The control line of the second pixel overlaps the data line of the first pixel and does not overlap the active pattern of the first pixel.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
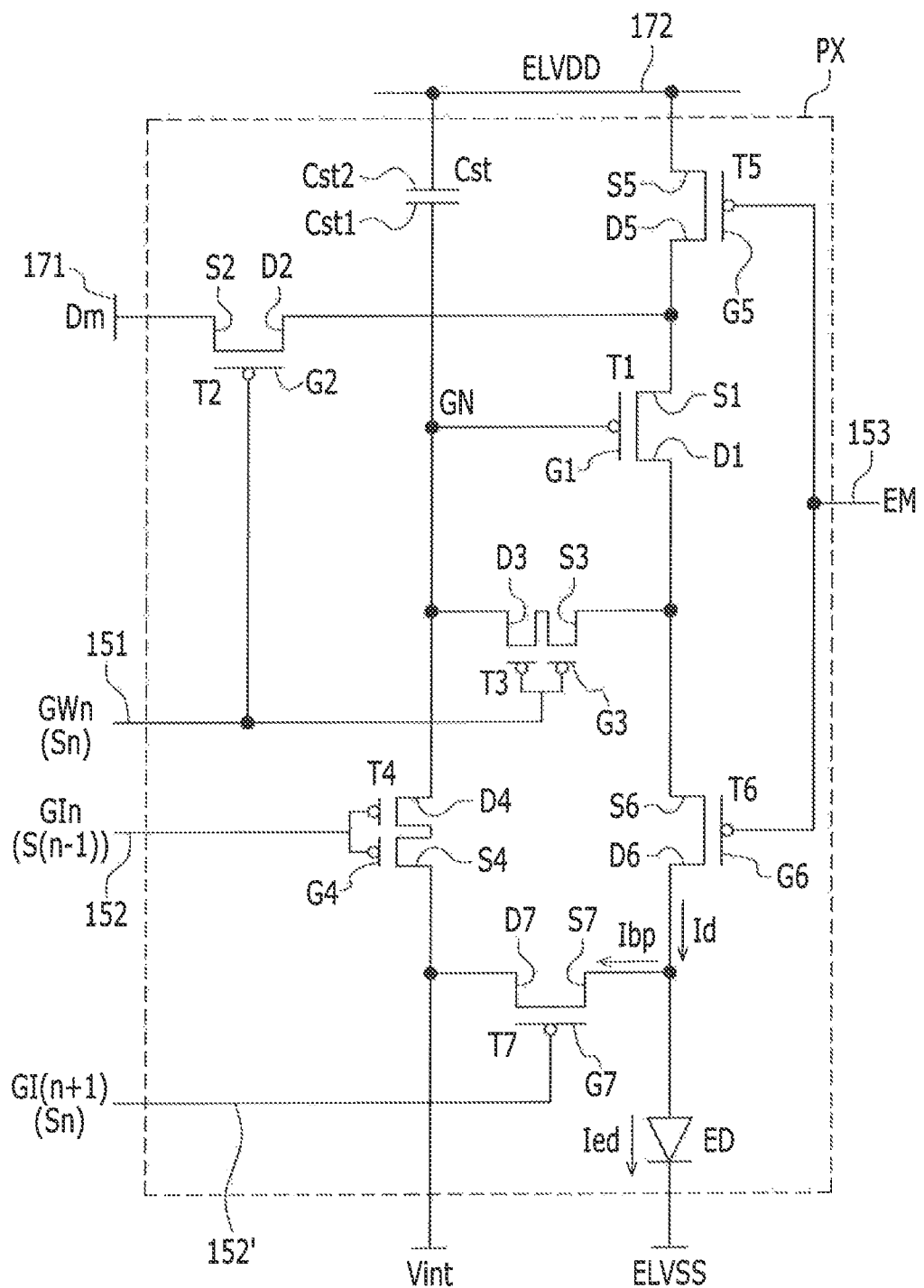
FIG. 1 is a circuit diagram illustrating a single pixel of a display device, according to an exemplary embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Like reference numerals may designate like elements throughout the specification and drawings.

In addition, the size and thickness of the various layers, films, panels, regions, etc. shown in the drawings may be exaggerated for clarity, better understanding, and ease of description, but the present invention is not limited thereto.

It will be understood that when an element such as a layer, film, region, or substrate is referred to as being "on" another element, it can be directly on the other element or intervening elements may also be present.

Now, a display device according to an exemplary embodiment of the present invention will be described in detail with reference to accompanying drawings.

Referring to FIG. 1, a display device, according to an exemplary embodiment of the present invention, includes a plurality of pixels PX displaying an image and a plurality of signal lines 151, 152, 152', 153, 171, and 172. While one pixel is illustrated, it is to be understood that the display device may include a plurality of pixels, each of which having a similar structure. One pixel PX may include a plurality of transistors T1, T2, T3, T4, T5, T6, and T7, a capacitor Cst, and at least one light emitting diode (LED) ED that are connected to the plurality of signal lines 151, 152, 152', 153, 171, and 172. According to an exemplary embodiment of the present invention, each pixel PX includes one light emitting diode (LED) ED. However, it is to be understood that each pixel may include multiple LEDs.

The signal lines 151, 152, 152, 153, 171, and 172 may include a plurality of scan lines 151, 152, and 152', a plurality of control lines 153, a plurality of data lines 171, and a plurality of driving voltage lines 172.

The plurality of scan lines 151, 152, and 152' may respectively transmit scan signals GWn, GIn, and GI(n+1). The scan signals GWn, GIn, and GI(n+1) may transmit a gate-on voltage and a gate-off voltage capable of turning-on/turning-off the transistors T2, T3, T4, and T7 included in the pixel PX.

The scan lines 151, 152, and 152' connected to one pixel PX may include a first scan line 151 transmitting the scan signal GWn, a second scan line 152 transmitting the scan signal GIn having the gate-on voltage at a different time from that of the first scan line 151, and a third scan line 152' transmitting the scan signal GI(n+1). According to an exemplary embodiment of the present invention, the second scan line 152 transmits the gate-on voltage at an earlier time than that of the first scan line 151. For example, when the scan signal GWn is an n-th scan signal Sn among scan signals applied during one frame (where n is a positive integer), the scan signal GIn may be a previous scan signal such as a (n−1)-th scan signal S(n−1), and the scan signal GI(n+1) may be an n-th scan signal Sn. However, the present invention is not limited to this particular arrangement, and the scan signal GI(n+1) may be a scan signal from the n-th scan signal Sn.

The control line 153 may transmit a control signal, and particularly, the control line 153 may transmit an emission control signal controlling the emission of the light emitting diode (LED) ED included in the pixel PX. The control signal transmitted by the control line 153 may transmit the gate-on voltage and the gate-off voltage, and may transmit a waveform different from the scan signal transmitted by the scan lines 151, 152, and 152'.

The data line 171 may transmit the data signal Dm, and the driving voltage line 172 may transmit the driving voltage ELVDD. The data signal Dm may have other voltage levels according to the image signal input to the display device, and the driving voltage ELVDD may have a substantially constant level.

The display device may further include a driver transmitting a signal to the plurality of signal lines 151, 152, 152', 153, 171, and 172. For example, the driver may include a scan driver transmitting the scan signal to the plurality of scan lines 151, 152, and 152' and a data driver transmitting the data signal to the data line 171. The driver may be directly formed on the display panel included in the display device along the plurality of transistors T1-T7 included in the pixel PX, or may be attached to the display panel as at least one driving circuit chip. Alternatively, the driver may be attached on a printed circuit film connected to the display panel to transmit the signal to the display panel. The driver or the printed circuit film may be disposed around the display area in which the plurality of pixels PX is disposed.

The plurality of transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal GIn to the fourth transistor T4, the third scan line 152' may transmit the scan signal GI(n+1) to the seventh transistor T7, and the control line 153 may transmit the control signal EM to the fifth transistor T5 and the sixth transistor T6.

A gate electrode G1 of the first transistor T1 is connected to one terminal Cst1 of the capacitor Cst through a driving gate node GN, a source electrode S1 of the first transistor T1 is connected to the driving voltage line 172 via the fifth transistor T5, and a drain electrode D1 of the first transistor T1 is connected to an anode of the light emitting diode (LED) ED via the sixth transistor T6. The first transistor T1 receives a data signal Dm transmitted by the data line 171 under the control of a switching operation of the second transistor T2 to supply a driving current id to the organic light emitting diode (LED) ED.

The gate electrode G2 of the second transistor T2 is connected to the first scan line 151, a source electrode S2 of the second transistor T2 is connected to the data line 171, and a drain electrode D2 of the second transistor T2 is connected to the driving voltage line 172 via the fifth transistor T5, while also being connected to the source electrode S1 of the first transistor T1. The second transistor T2 is turned on under the control of the scan signal GWn transmitted through the first scan line 151 such that the data signal Dm transmitted from the data line 171 may be transmitted to the source electrode S1 of the first transistor T1.

A gate electrode G3 of the third transistor T3 is connected to the first scan line 151, and a source electrode S3 of the third transistor T3 is connected to the anode of the light emitting diode (LED) ED via the sixth transistor T6 while also being connected to the drain electrode D1 of the first transistor T1. A drain electrode D3 of the third transistor T3 is connected to a drain electrode D4 of the fourth transistor T4, one terminal Cst1 of the capacitor Cst, and the gate electrode G1 of the first transistor T1. The third transistor T3 is turned on under the control of the scan signal GWn transmitted through the first scan line 151 to diode-connect the first transistor T1 by connecting the gate electrode G1 and the drain electrode D1 of the first transistor T1 to each other.

A gate electrode G4 of the fourth transistor T4 is connected to the second scan line 152. A source electrode S4 of the fourth transistor T4 is connected to a terminal of an initialization voltage Vint. A drain electrode D4 of the fourth transistor T4 is connected to one terminal Cst1 of the capacitor Cst and the gate electrode G1 of the first transistor T1 through the drain electrode D3 of the third transistor T3. The fourth transistor T4 is turned on under the control of the scan signal GIn transmitted through the second scan line 152 to transmit the initialization voltage Vint to the gate electrode G1 of the first transistor T1, thereby performing an operation of initializing the voltage of the gate electrode G1 of the first transistor T1.

A gate electrode G5 of the fifth transistor T5 is connected to the control line 153. A source electrode S5 of the fifth transistor T5 is connected to the driving voltage line 172. A drain electrode D5 of the fifth transistor T5 is connected to the source electrode S1 of the first transistor T1 and the drain electrode D2 of the second transistor T2.

A gate electrode G6 of the sixth transistor T6 is connected to the control line 153. A source electrode S6 of the sixth transistor T6 is connected to the drain electrode D1 of the first transistor T1 and the source electrode S3 of the third transistor T3. A drain electrode D6 of the sixth transistor T6 is electrically connected to the anode of the light emitting diode (LED) ED. The fifth transistor T5 and the sixth transistor T6 are simultaneously turned on under the control of the emission control signal EM transmitted through the control line 153, thereby the driving voltage ELVDD is compensated through the diode-connected first transistor T1 to be transmitted to the light emitting diode (LED) ED.

A gate electrode G7 of the seventh transistor T7 is connected to the third scan line 152'. A source electrode S7 of the seventh transistor T7 is connected to the drain electrode D6 of the sixth transistor T6 and the anode of the light emitting diode (LED) ED. A drain electrode D7 of the seventh transistor T7 is connected to the terminal of the initialization voltage Vint and the source electrode S4 of the fourth transistor T4.

The transistors T1, T2, T3, T4, T5, T6, and T7 may be P-type channel transistors such as a PMOS, however the present invention is not limited thereto, and at least one among the transistors T1, T2, T3, T4, T5, T6, and T7 may be an N-type channel transistor.

One terminal Cst1 of the capacitor Cst is connected to the gate electrode G1 of the first transistor T1 as described above, and the other terminal Cst2 thereof is connected to the driving voltage line 172. A cathode of the light emitting diode (LED) ED is connected to the terminal of the common voltage ELVSS transmitting the common voltage ELVSS to receive the common voltage ELVSS.

The structure of the pixel PX, according to an exemplary embodiment of the present invention, is not necessarily limited to the structure shown in FIG. 1, and a number of transistors and a number of capacitors that are included in one pixel PX and a connection relationship thereof may be variously modified.

Figure 2:
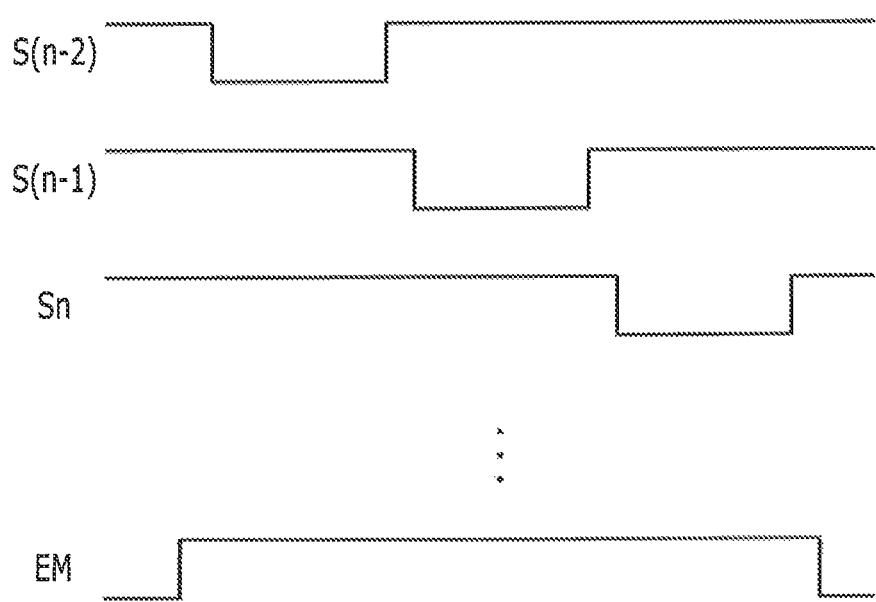
FIG. 2 is a timing diagram illustrating a signal applied to a pixel of a display device, according to an exemplary embodiment of the present invention.

Next, an operation of the display device according to an exemplary embodiment of the present invention will be described with reference to FIG. 2 as well as FIG. 1. FIG. 2 is a timing diagram illustrating a signal applied to a pixel of a display device according to an exemplary embodiment of the present invention. In the present description, an example in which the transistors T1, T2, T3, T4, T5, T6, and T7 are P-type channel transistors is described, and the operation of one frame is described. However, it is to be understood that other types of channel transistors may be used and additional frames may be operated in a similar or different manner.

Referring to FIG. 2, in one frame, the scan signals S(n−2), S(n−1), Sn, . . . of a low level may be sequentially applied to the plurality of first scan lines 151 connected to the plurality of pixels PX.

The scan signal Gin of the low level is supplied through the second scan line 152 during an initialization period. For example, the scan signal Gin may be a (n−1)-th scan signal S(n−1). Thus, the fourth transistor T4 is turned on by the scan signal GIn being at the low level. The initialization voltage Vint is transmitted to the gate electrode G1 of the first transistor T1 through the fourth transistor T4. The first transistor T1 is initialized by the initialization voltage Vint.

Subsequently, if the scan signal GWn of the low level is supplied through the first scan line 151 during a data programming and compensation period, the second transistor T2 and the third transistor T3 are turned on in response to the scan signal GWn being in the low level. For example, the scan signal GWn may be the n-th scan signal Sn. In this case, the first transistor T1 is diode-connected by the turned-on third transistor T3 and is biased in a forward direction. Accordingly, a compensation voltage (Dm+Vth, where Vth is a negative value) that is decreased by a threshold voltage Vth of the first transistor T1 from the data signal Dm supplied from the data line 171 is applied to the gate electrode G1 of the first transistor T1. For example, the gate voltage applied to the gate electrode G1 of the first transistor T1 becomes the compensation voltage (Dm+Vth).

The driving voltage ELVDD and the compensation voltage (Dm+Vth) are respectively applied to the terminals of the capacitor Cst, and the capacitor Cst is charged with a charge corresponding to a voltage difference of both terminals.

Next, the light emitting control signal EM supplied from the control line 153 is changed from the high level to the low level during a light emitting period. The time at which the emission control signal EM is changed from the high level to the low level may be after the scan signal GWn is applied to all first scan lines 151 in one frame. Thus, during the light emitting period, the fifth transistor T5 and the sixth transistor T6 are turned on by the light emitting control signal EM of the low level. Thus, a driving current Id is generated according to the voltage difference between the gate voltage of the gate electrode G1 of the first transistor T1 and the driving voltage ELVDD, and the driving current Id is supplied to the light emitting diode (LED) ED through the sixth transistor T6, thereby a current Ied flows to the light emitting diode (LED) ED. The gate-source voltage Vgs of the first transistor T1 is maintained as "(Dm+Vth)-ELVDD" by the capacitor Cst during the light emitting period, and according to a current-voltage relationship of the first transistor T1, the driving current Id may be proportional to a square of a value obtained by subtracting the threshold voltage from the driving gate-source voltage (Dm-ELVDD)$^2$. Accordingly, the driving current Id may be determined regardless of the threshold voltage Vth of the first transistor T1.

During an initialization period, the seventh transistor T7 receives the scan signal GI(n+1) of the low level through the third scan line 152' to be turned on. The scan signal GI(n+1) may be the n-th scan signal Sn. A part of the driving current Id flows out through the turned-on seventh transistor T7 as a bypass current Ibp.

Next, the detailed structure of the display device, according to an exemplary embodiment of the present invention, will be described with reference to FIG. 3 to FIG. 7 along with FIG. 1 and FIG. 2.

A planar structure of the display device according to an exemplary embodiment of the present invention will be first described with reference to FIG. 3 and FIG. 4, and then a cross-sectional structure of the display device will be described with reference to FIG. 5 to FIG. 7.

Figure 3:
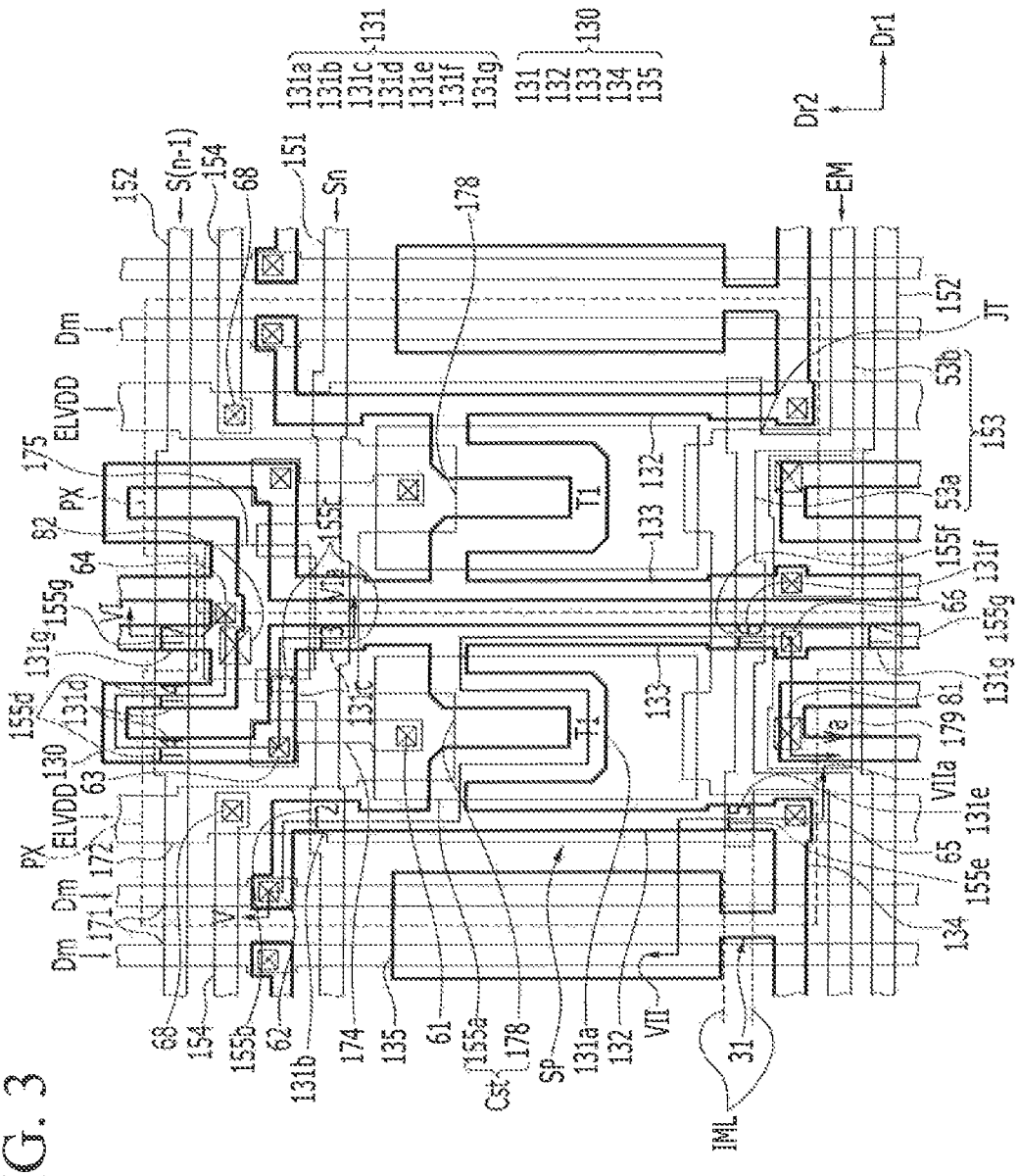
FIG. 3 is a layout view illustrating two adjacent pixels of a display device, according to an exemplary embodiment of the present invention.
Figure 4:
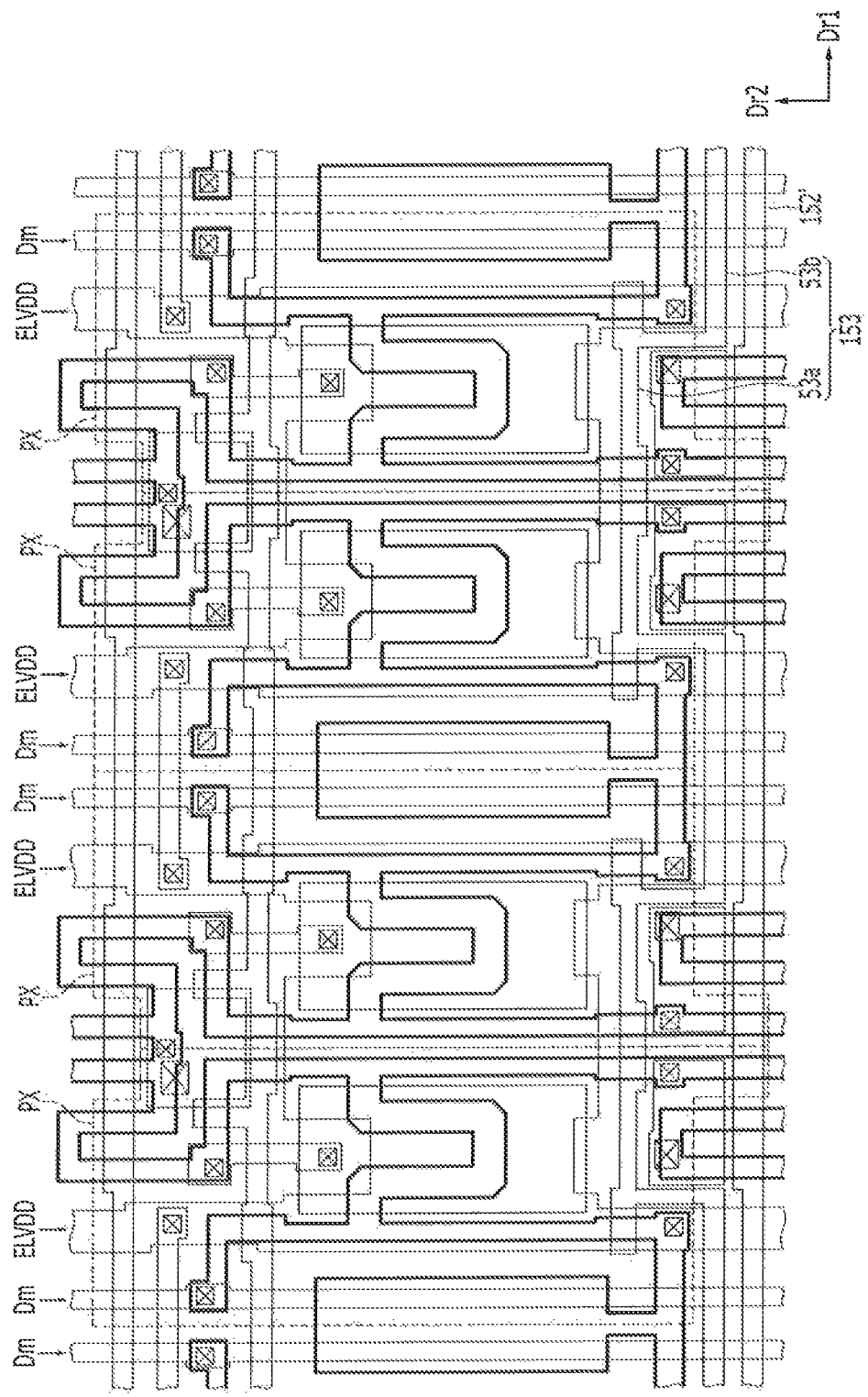
FIG. 4 is a layout view illustrating four adjacent pixels of a display device, according to an exemplary embodiment of the present invention.

Referring to FIG. 3, one pixel of the display device, according to an exemplary embodiment of the present invention, may include a plurality of transistors T1, T2, T3, T4, T5, T6, and T7 and a capacitor Cst that are connected to a plurality of scan lines 151, 152, and 152', a control line 153, a data line 171, and a driving voltage line 172. The plurality of scan lines 151, 152, and 152' and the control line 153 are included in a first conductive layer such that they may be disposed within the same layer, as may be seen in the cross-sectional view, and may include the same material, and the data line 171 and the driving voltage line 172 are included in a second conductive layer that is disposed at a different layer from that of the first conductive layer such that they may be disposed within the same layer and may include the same material.

Two pixels PX adjacent in the first direction Dr1 may have an axisymmetric structure with respect to a boundary therebetween. However, the present invention is not limited to this particular arrangement. The data line 171 and the driving voltage line 172 may also be disposed with the axisymmetric structure with respect to the boundary between two adjacent pixels PX. Accordingly, the plurality of data lines 171 may include two data lines 171 that are directly adjacent to each other and two data line disposed with two pixels PX therebetween.

The data line 171 and the driving voltage line 172 may extend substantially in the second direction Dr2. The second direction Dr2 is a direction perpendicular to the first direction Dr1.

The driving voltage line 172 may include an extension part 178 extending in the first direction Dr1. The extension part 178 extends in a side opposite to the data line 171 directly adjacent to the driving voltage line 172, and one extension part 178 may be included in each pixel PX. Two extension parts 178 disposed at two pixels PX adjacent in the first direction Dr1 without two data lines 171 may be connected to each other. Accordingly, the driving voltage ELVDD transmitted by the driving voltage line 172 for two adjacent pixels PX may also be transmitted in the first direction Dr1 through the extension parts 178 connected to each other.

The adjacent driving voltage lines 172 may be connected to each other through a connecting member 154. The connecting member 154 may be substantially extended in the first direction Dr1. The driving voltage line 172 is connected to the connecting member 154 through a contact hole 68. Accordingly, the driving voltage. ELVDD is transmitted along the driving voltage line 172 in the second direction Dr2 and is transmitted through the connecting member 154 in the first direction Dr1, thereby being transmitted in a mesh shape over the entire display area of the display device. Accordingly, a voltage drop of the driving voltage ELVDD may be minimized. The connecting member 154 may be included in the first conductive layer, as may be seen in the cross-sectional view.

Referring to FIG. 3, the plurality of scan lines 151, 152, and 152' and the control line 153 may respectively and substantially extend in the first direction Dr1, thereby crossing the data line 171 and the driving voltage line 172. The first scan line 151 may be disposed between the second scan line 152 and the control line 153, as may be seen in a plan view. The third scan line 152' may transmit the scan signal GI(n+1) after the scan signal GIn is transmitted by the second scan line 152. For example, as described above, when the first scan line 151 transmits the n-th scan signal Sn, the third scan line 152' may also transmit the n-th scan signal Sn.

The control line 153 may have, as shown in FIG. 3, a shape that is regularly changed with a predetermined cycle (or a pitch), and the predetermined pitch may be the same as a width of the n pixels PX (where n is a positive integer) in the first direction Dr1. FIG. 3 shows an example in which the control line 153 has the regular shape with the width of two pixels PX as the pitch in the first direction Dr1. The detailed shape of the control line 153 is described below.

Each channel of the plurality of transistors T1, T2, T3, T4, T5, T6, and T7 may be formed in one active pattern 130, and the active pattern 130 may be bent in various shapes. The active pattern 130 may include a semiconductor material such as amorphous/polysilicon or an oxide semiconductor.

The active pattern 130 includes a channel region 131 of a semiconductor and a conductive region. The channel region 131 includes channel regions 131a, 131b, 131c, 131d, 131e, 131f, and 131g forming each channel of the transistors T1, T2, T3, T4, T5, T6, and T7. The active pattern 130, with the exception of the channel regions 131a, 131b, 131c, 131d, 131e, 131f, and 131g, may be the conductive region. The conductive region has a higher carrier concentration than that of the channel regions 131a, 131b, 131c, 131d, 131e, 131f, and 131g. The conductive region is disposed at both sides of each of the channel regions 131a, 131b, 131c, 131d, 131e, 131f, and 131g, and may be a source region and a drain region of the corresponding transistors T1, T2, T3, T4, T5, T6, and T7.

Referring to FIG. 3, the active pattern 130 of one pixel PX may include a first longitudinal part 132 and a second longitudinal part 133 with the channel region 131a of the first transistor T1 disposed at a center therebetween. The first longitudinal part 132 and the second longitudinal part 133 may respectively extend substantially in the second direction Dr2.

The first transistor T1 includes the channel region 131a, the source region and the drain region as the conductive regions of the active pattern 130 disposed at both sides of the channel region 131a, and a driving gate electrode 155a overlapping the channel region 131a. The channel region 131a may be curved at least one time. For example, the channel region 131a of the first transistor T1 may have a meandering shape, a wave shape, or a zigzag shape. FIG. 3 and FIG. 4 show an example in which the channel region 131a forms an approximate "U" shape. The channel region 131a is connected to the first longitudinal part 132 and the second longitudinal part 133 of the active pattern 130. The conductive region of the first longitudinal part 132 corresponds to the source region of the first transistor T1. The second longitudinal part 133 corresponds to the drain region of the first transistor T1.

The driving gate electrode 155a may be disposed between the first longitudinal part 132 and the second longitudinal part 133 of the active pattern 130. The driving gate electrode 155a may be included in the first conductive layer, and may be connected to a connecting member 174 through a contact hole 61. The connecting member 174 may be included in the second conductive layer, as may be seen in the cross-sectional view.

The driving gate electrode 155a and the channel region 131a of the first transistor T1 may be disposed between the first scan line 151 and the control line 153.

The second transistor T2 includes the channel region 131b, the source region and the drain region as the conductive regions of the active pattern 130 disposed at both sides of the channel region 131b, and a gate electrode 155b of the channel region 131b. The part overlapping the channel region 131b among the first scan line 151 may form the gate electrode 155b. The conductive region of the active pattern 130 connected to the channel region 131b and disposed above the first scan line 151 as the source region of the second transistor T2 is connected to the data line 171 through a contact hole 62. The channel region 131*b* is connected to the first longitudinal part 132 of the active pattern 130, and the part of the first longitudinal part 132 disposed under the channel region 131*b* corresponds to the drain region of the second transistor T2.

The third transistor T3 includes the channel region 131*c*, the source region and the drain region as the conductive regions of the active pattern 130 disposed at both sides of the channel region 131*c*, and a gate electrode 155*c* overlapping the channel region 131*c*. The part overlapping the channel region 131*c* among the first scan line 151 may form the gate electrode 155*c*. The gate electrode 155*c* may be formed of two parts to prevent a leakage current. The conductive region of the active pattern 130 disposed above the first scan line 151 and connected to the channel region 131*c* as the drain region of the third transistor T3 is connected to the connecting member 174 though a contact hole 63. The channel region 131*c* is connected to the second longitudinal part 133 of the active pattern 130, and the part of the second longitudinal part 133 disposed under the channel region 131*c* corresponds to the source region of the third transistor T3.

The fourth transistor T4 includes the channel region 131*d*, the source region and the drain region as the conductive regions of the active pattern 130 disposed at both sides of the channel region 131*d*, and a gate electrode 155*d* overlapping the channel region 131*d*. The part overlapping the channel region 131*d* among the second scan line 152 may form the gate electrode 155*d*. The gate electrode 155*d* may be formed of two parts to prevent the leakage current. The conductive region of the active pattern 130 that is disposed below the second scan line 152 and is not connected to the third transistor T3 as the source region of the fourth transistor T4 is connected to a connecting member 175 through a contact hole 64. The connecting member 175 may be included in the second conductive layer, as may be seen in the cross-sectional view.

The fifth transistor T5 includes the channel region 131*e*, the source region and the drain region as the conductive regions of the active pattern 130 disposed at both sides of the channel region 131*e*, and a gate electrode 155*e* overlapping the channel region 131*e*. The part overlapping the channel region 131*e* among the control line 153 may form the gate electrode 155*e*. The conductive region of the active pattern 130 disposed below the control line 153 as the source region of the fifth transistor T5 is connected to the driving voltage line 172 through a contact hole 65. The channel region 131*e* is connected to the first longitudinal part 132 of the active pattern 130, and the part of the first longitudinal part 132 disposed on the channel region 131*e* corresponds to the drain region of the fifth transistor T5.

The sixth transistor T6 includes the channel region 131*f*, the source region and the drain region as the conductive regions of the active pattern 130 disposed at both sides of the channel region 131*f*, and a gate electrode 155*f* overlapping the channel region 131*f*. The part of the channel region 131*f* among the control line 153 may form the gate electrode 155*f*. The conductive region of the active pattern 130 disposed below the control line 153 as the drain region of the sixth transistor T6 is connected to a connecting member 179 through a contact hole 66. The connecting member 179 may be included in the second conductive layer, as may be seen in the cross-sectional view. The channel region 131*f* is connected to the second longitudinal part 133 of the active pattern 130, and the part of the second longitudinal part 133 disposed on the channel region 131*f* corresponds to the source region of the sixth transistor T6.

The seventh transistor T7 includes the channel region 131*g*, the source region and the drain region as the conductive regions of the active pattern 130 disposed at both sides of the channel region 131*g*, and a gate electrode 155*g* overlapping the channel region 131*g*. The part overlapping the channel region 131*g* among the second scan line 152 or the third scan line 152' may form the gate electrode 155*g*. The conductive region of the active pattern 130 disposed below the second scan line 152 or the third scan line 152' as the drain region of the seventh transistor T7 is connected to the connecting member 175 through the contact hole 64. The conductive region of the active pattern 130 disposed above the second scan line 152 or the third scan line 152' as the source region of the seventh transistor T7 is connected to the drain region of the sixth transistor T6 and is connected to the connecting member 179 through the contact hole 66.

The capacitor Cst may include the driving gate electrode 155*a* and the extension part 178 of the driving voltage line 172 overlapping each other on the plane as two terminals. The capacitor Cst may maintain the voltage difference corresponding to the difference between the driving voltage ELVDD transmitted through the driving voltage line 172 and the voltage of the driving gate electrode 155*a*.

The driving gate electrode 155*a* is connected to one terminal of the connecting member 174 through the contact hole 61, and the other terminal of the connecting member 174 is connected to the drain region of the third transistor T3 and the drain region of the fourth transistor T4 through the contact hole 63. The connecting member 174 may extend substantially in the second direction Dr2. The connecting member 174 corresponds to the driving gate node GN shown in the circuit diagram of FIG. 1 along with the driving gate electrode 155*a*.

The connecting member 179 may be connected to the pixel electrode through a contact hole 81, and the connecting member 175 may be connected to the initialization voltage line transmitting the initialization voltage Vint through a contact hole 82.

The active pattern 130 further includes a shielding part 135 overlapping the data line 171 and extending parallel to the data line 171. The shielding part 135 as the conductive region may completely cover the width of the data line 171 in the first direction Dr1. For example, the width of the shielding part 135 in the first direction Dr1 may be larger than the width of the data line 171 in the first direction Dr1.

According to the symmetrical structure of two adjacent pixels PX, one shielding part 135 may overlap both of the two adjacent data lines 171.

The shielding part 135 may be connected to the first longitudinal part 132 through a connection part 134. The connection part 134 as the conductive region of the active pattern 130 extends substantially in the first direction Dr1, and is connected to the driving voltage line 172 through the contact hole 65, thereby receiving the driving voltage ELVDD.

As described above, if the shielding part 135 having conductivity overlaps the data line 171, the data line 171 is shielded such that the parasitic capacitance between the data line 171 and the adjacent driving gate electrode 155*a* is blocked, thereby the voltage of the driving gate electrode 155*a* may be prevented from being changed along with the signal change of the data signal Dm such that the driving current Id of the light emitting diode (LED) ED is not changed. For example, the crosstalk as the luminance changes due to the parasitic capacitance between the data line 171 and the driving gate electrode 155*a* may be prevented.

Referring to FIG. 3, the shielding part 135 may include a recess portion 31 having a smaller width than the periphery in the first direction Dr1. In the recess portion 31, the shielding part 135 might not overlap the data line 171. A size of the recess portion 31 may be appropriately controlled by considering the shielding effect of the data line 171 by the overlapping area of the shielding part 135 and the data line 171 and a delay degree of the data signal Dm by the overlapping with the shielding part 135. The position of the recess portion 31 may be near the position where the shielding part 135 and the connection part 134 are connected.

The shielding part 135 and the connection part 134 of the active pattern 130 might not overlap the signal line transmitting the signal in the first direction Dr1. For example, the shielding part 135 and the connection part 134 of the active pattern 130 might not overlap the plurality of scan lines 151, 152, and 152 and the plurality of control lines 153. The control line 153 as the signal line is adjacent to the shielding part 135 in the first direction Dr1, and the control line 153 has a shape that does not overlap the shielding part 135 or the connection part 134.

For example, the control line 153 includes a plurality of separated main line parts 53a and a plurality of detour parts 53b connecting two adjacent main line parts 53a.

Each main line part 53a extends substantially in the first direction Dr1, and passes two adjacent pixels PX disposed between two data lines 171 to be continuously extended. Accordingly, each main line part 53a may be disposed entirely between two data lines 171 adjacent via two pixels PX and might not overlap the data line 171. For example, the main line part 53a might only extend to the neighborhood of the data line 171 (or the neighborhood of the shielding part 135 and the connection part 134). An end part of each main line part 53a is separated from the adjacent data line 171, and may be disposed between the channel region 131e of the fifth transistor T5 and the shielding part 135 or the data line 171.

The main line part 53a includes a part overlapping the channel region 131e of the longitudinal part 132 of the active pattern 130 and a part overlapping the channel region 131f of the longitudinal part 133 of the active pattern 130. An imaginary straight extending line IML of the main line part 53a may pass the shielding part 135, however this line is not substantially overlapped with the shielding part 135. The imaginary straight extending line IML of the main line part 53a may cross the recess portion 31 of the shielding part 135, but the present invention is not limited to this particular arrangement.

The detour part 53b connects two main line parts 53a to two adjacent data lines 171. One terminal of each detour part 53b may be connected to one transverse side of the main line part 53a at a connection position of an end of the main line part 53a. The channel region 131e may be disposed between the ends of the connection position JT and the main line part 53a. The detour part 53b may be disposed at the opposite side of the driving gate electrode 155a with respect to the main line part 53a and the imaginary straight extending line IML of the main line part 53a.

The detour part 53b, having a well shape, has a shape extending along the periphery of the end of the first longitudinal pan 132 of the active pattern 130, the contact hole 65, and the connection part 134. For example, the detour part 53b extends from the connection position JT of the main line part 53a, extends in the second direction Dr2, is bent in the first direction Dr1, and then crosses the data line 171 and the driving voltage line 172, and is again bent in the second direction Dr2 to be connected to another adjacent main line part 53a. For example, the detour part 53b may include a part connected to the main line part 53a and extending in the second direction Dr2 and a part extending in the first direction Dr2 and crossing the data line 171 and the driving voltage line 172.

The detour part 53b may have a shape enclosing the end of the first longitudinal part 132 of the active pattern 130 and the contact hole 65 along the end main line part 53a. Accordingly, the contact hole 65 may be disposed between the channel region 131e of the fifth transistor T5 and the detour part 53b. Also, the detour part 53b may include a part extending along a space between the connection part 134 and the third scan line 152'.

As described above, the detour part 53b of the control line 153 detours under the active pattern 130 including the shielding part 135 and the connection part 134 to extend along a lower edge of the connection part 134, thereby not overlapping the active pattern 130 (particularly, the shielding part 135 and the connection part 134). Accordingly, the control line 153 does not overlap the active pattern 130, except at the channel region 131e of the fifth transistor T5 and the channel region 131f of the sixth transistor T6, and particularly, does not overlap the shielding part 135 and the connection part 134.

If the control line 153 does not include the detour part 53b and constantly extends in the first direction Dr1 like the scan lines 151, 152, and 152, the control line 153 may overlap the shielding part 135 of the active pattern 130, and in this case, an additional parasitic transistor having the overlapping part as the channel region may be generated. If the additional parasitic transistor is formed, the shielding part 135 is substantially floated such that the voltage of the shielding part 135 does not maintain the predetermined voltage level such as the driving voltage ELVDD and is changed. Thus, the data signal Dm transmitted to the data line 171 is changed by the shielding part 135 such that a color deviation or a stain may occur on the image displayed by the display panel 100.

According to exemplary embodiments of the present invention, the control line 153 detours downward so as not to overlap the shielding part 135 and the connection part 134 of the active pattern 130 and to form the detour part 53b, and the detour part 53b is bent and extends along the lower periphery of the connection part 134 to not overlap the active pattern 130 such that the unnecessary overlapping of the active pattern 130 and the control line 153 and the formation of the parasitic transistor according thereto are not realized. Accordingly, the data signal Dm transmitted by the data line 171 may be prevented from being unduly changed, thereby blocking the color deviation and the stain from being generated on the image displayed by the display device.

Also, if the control line 153 does not detour downward around the shielding part 135 and instead detours upward to pass the space SP shown in FIG. 3, the control line 153 must extend along the edge of the shielding part 135 elongated in the second direction Dr2, and in this case, the driving voltage line 172 adjacent to the shielding part 135 and elongated and extending in the second direction Dr2 overlaps the control line 135 on the wide area such that there is a high risk of a short circuit. However, according an exemplary embodiment of the present invention, the detour part 53b of the control line 153 does not extend between the shielding part 135 and the driving voltage line 172, and detours downward so a short circuit with the driving voltage line 172 is unlikely to occur.

Next, an example of the cross-sectional structure of the display device according to an exemplary embodiment of the present invention will be described with reference to FIG. 5 to FIG. 7 along with FIG. 3 and FIG. 4.

The display device, according to an exemplary embodiment of the present invention, may include a substrate 110. The substrate 110 may include an inorganic insulating material such as glass or an organic insulating material such as a plastic of polyimide (PI), and may be flexible.

A buffer layer 120 may be disposed on the substrate 110. The buffer layer 120 blocks impurities from the substrate 110 from infiltrating layers above the buffer layer 120, particularly the semiconductor member 130. In this way, the semiconductor member 130 may be protected from impurities that may degrade characteristics of the semiconductor member 130 and may reduce stress applied to the semiconductor member 130. The buffer layer 120 may include an inorganic insulating material such as a silicon nitride (SiNx) or a silicon oxide (SiOx), or an organic insulating material. Part or all of the buffer layer 120 may be omitted.

The above-described active pattern 130 is disposed on the buffer layer 120, and a gate insulating layer 140 is disposed on the semiconductor member 130.

A first conductive layer including the plurality of scan lines 151, 152, and 152', the control line 153, the driving gate electrode 155a, and the connecting member 154 that are described above may be disposed on the gate insulating layer 140. The first conductive layer may include a metal such as copper (Cu), aluminum (Al), molybdenum (Mo), or alloys thereof.

An interlayer insulating layer 160 is disposed on the first conductive layer and the gate insulating layer 140. The interlayer insulating layer 160 may include the inorganic insulating material such as the silicon nitride (SiNx), the silicon oxide (SiOx), or the organic insulating material.

The interlayer insulating layer 160 and/or the gate insulating layer 140 may include a contact hole 61 disposed on the driving gate electrode 155a. A contact hole 62 is disposed on the source region connected to the channel region 131b of the second transistor T2 among the conductive region of the active pattern 130. A contact hole 63 is disposed on the drain region connected to the channel region 131c of the third transistor T3 among the conductive region of the active pattern 130 or the drain region connected to the channel region 131d of the fourth transistor T4. A contact hole 64 is disposed on the source region connected to the channel region 131d of the fourth transistor T4 among the conductive region of the active pattern 130 or the drain region connected to the channel region 131g of the seventh transistor T7. A contact hole 65 is disposed on the source region connected to the channel region 131e of the fifth transistor T5 among the conductive region of the active pattern 130. A contact hole 66 is disposed on the drain region connected to the channel region 131f of the sixth transistor T6 among the conductive region of the active pattern 130. A contact hole 68 is disposed on the connecting member 154.

A second conductive layer including the data line 171, the driving voltage line 172, and the connecting members 174, 175, and 179 is disposed on the interlayer insulating layer 160. The second conductive layer may include the metal such as copper (Cu), aluminum (Al), molybdenum (Mo), or alloys thereof.

The data line 171 may be connected to the source region connected to the channel region 131b of the second transistor T2 through the contact hole 62 of the gate insulating layer 140 and the interlayer insulating layer 160. Referring to FIG. 7, the data line 171 may overlap the shielding part 135 of the active pattern 130 via the interlayer insulating layer 160 and the gate insulating layer 140 interposed therebetween.

Figure 5:
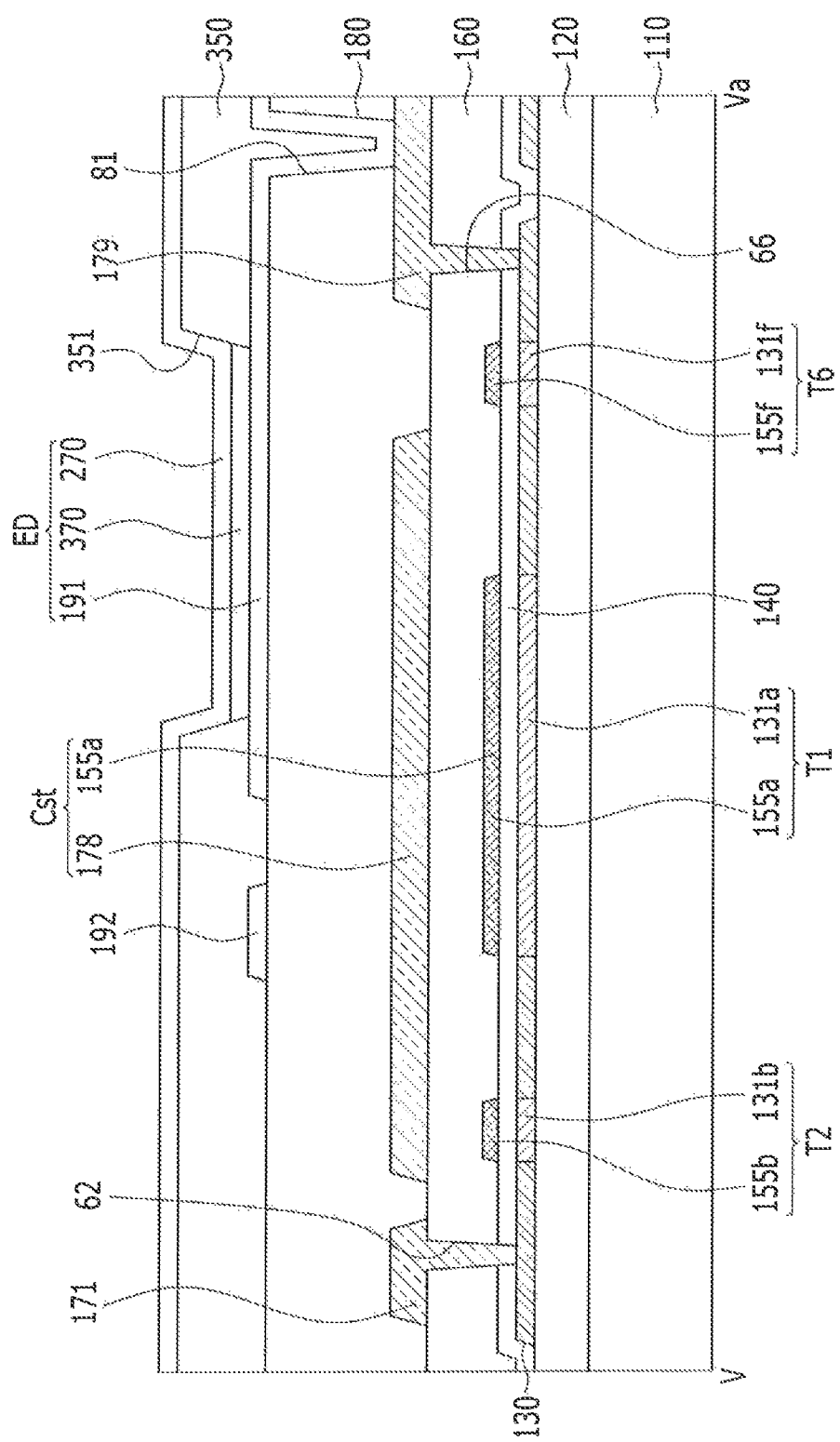
FIG. 5 is a cross-sectional view illustrating the display device shown in FIG. 3, taken along a line V-Va.

Referring to FIG. 5, the extension part 178 of the driving voltage line 172 overlaps the driving gate electrode 155a via the interlayer insulating layer 160, thereby forming the capacitor Cst.

Figure 6:
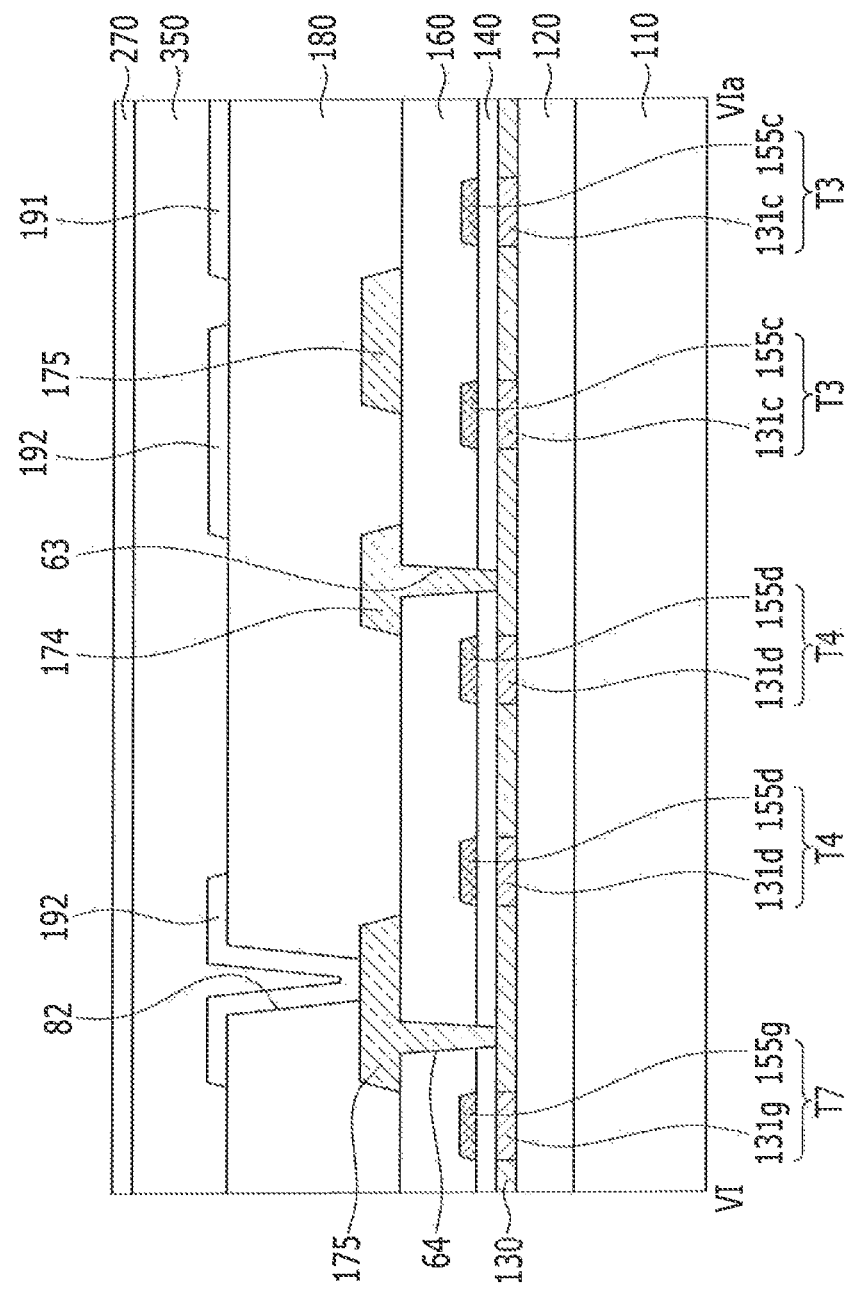
FIG. 6 is a cross-sectional view illustrating the display device shown in FIG. 3, taken along a line VI-VIa.
Figure 7:
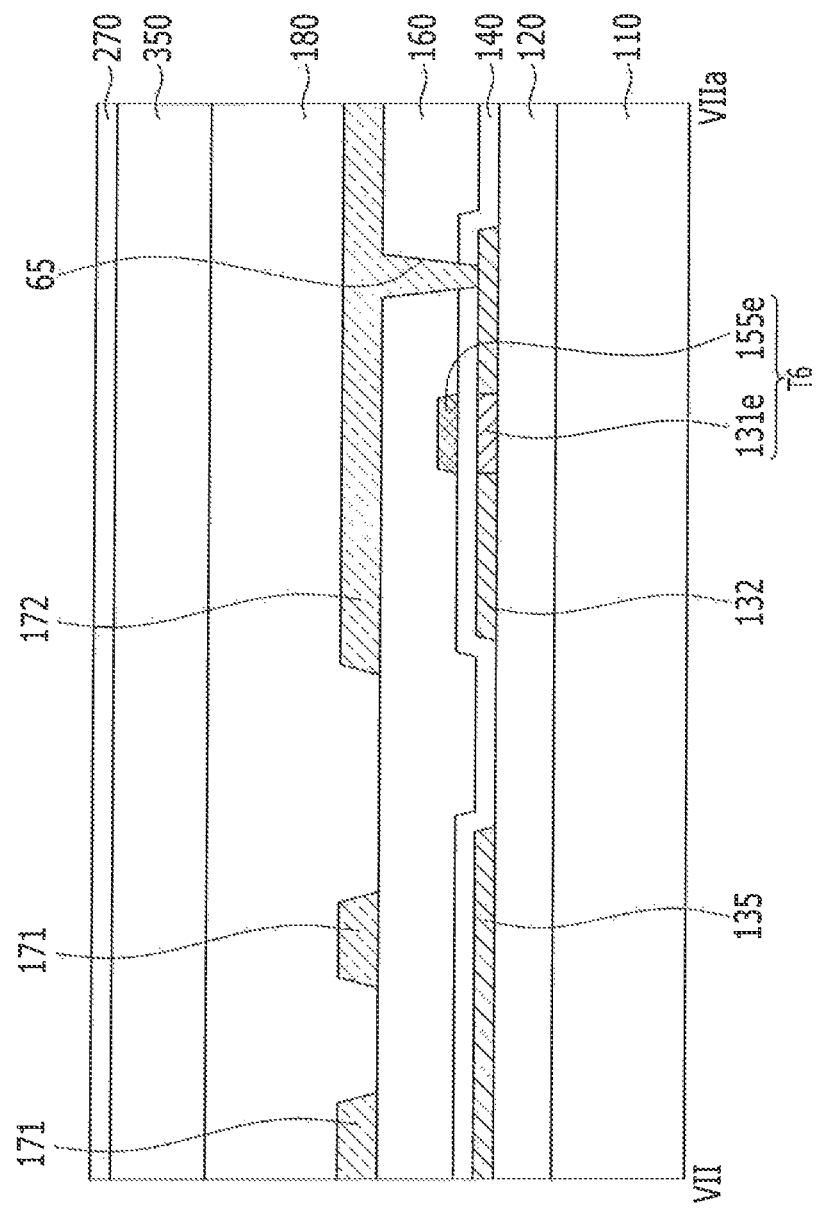
FIG. 7 is a cross-sectional view illustrating the display device shown in FIG. 3, taken along a line VII-VIIa.

Referring to FIG. 5 and FIG. 6, the connecting member 174 may be connected to the drain region connected to the channel region 131c of the third transistor T3 through the contact hole 63 and the drain region connected to the channel region 131d of the fourth transistor T4. The connecting member 175 may be connected to the source region connected to the channel region 131d of the fourth transistor T4 through the contact hole 64 and the drain region connected to the channel region 131g of the seventh transistor T7. Referring to FIG. 5, the connecting member 179 may be connected to the drain region connected to the channel region 131f of the sixth transistor T6 through the contact hole 66.

A passivation layer 180 is disposed on the second conductive layer and the interlayer insulating layer 160. The passivation layer 180 may include an organic insulating material such as a polyacrylate resin and a polyimide resin, and an upper surface of the passivation layer 180 may be substantially flat. The passivation layer 180 may include a contact hole 81 disposed on the connecting member 179 and a contact hole 82 disposed on the connecting member 175.

A third conductive layer including a pixel electrode 191 and an initialization voltage line 192 may be disposed on the passivation layer 180. Referring to FIG. 5 and FIG. 6, the pixel electrode 191 may be connected to the connecting member 179 through the contact hole 81, and the initialization voltage line 192 may be connected to the connecting member 175 through the contact hole 82.

A pixel defining layer (PDL) 350 may be disposed on the passivation layer 180, the initialization voltage line 192, and the pixel electrode 191. The pixel defining layer 350 may include a glass insulating material, and has an opening 351 disposed on the pixel electrode 191.

An emission layer 370 is disposed on the pixel electrode 191. The emission layer 370 may be disposed in the opening 351. The emission layer 370 may include an organic emission material or an inorganic emission material.

A common electrode 270 is disposed on the emission layer 370. The common electrode 270 is also formed on the pixel defining layer 350, thereby extending throughout the plurality of pixels PX.

The pixel electrode 191, the organic emission layer 370, and the common electrode 270 together form the light emitting diode (LED) ED.

An encapsulation layer protecting the organic light emitting diode ED may be disposed on the common electrode 270. The encapsulation layer may include an inorganic layer and an organic layer that are alternately deposited.

Next, the display device, according to an exemplary embodiment of the present invention, will be described with reference to FIG. 8 and FIG. 9 along with the above-described drawings. It is to be understood that to the extent that elements are not described, these elements may be similar to or identical to corresponding elements that are described elsewhere within the specification.

Figure 8:
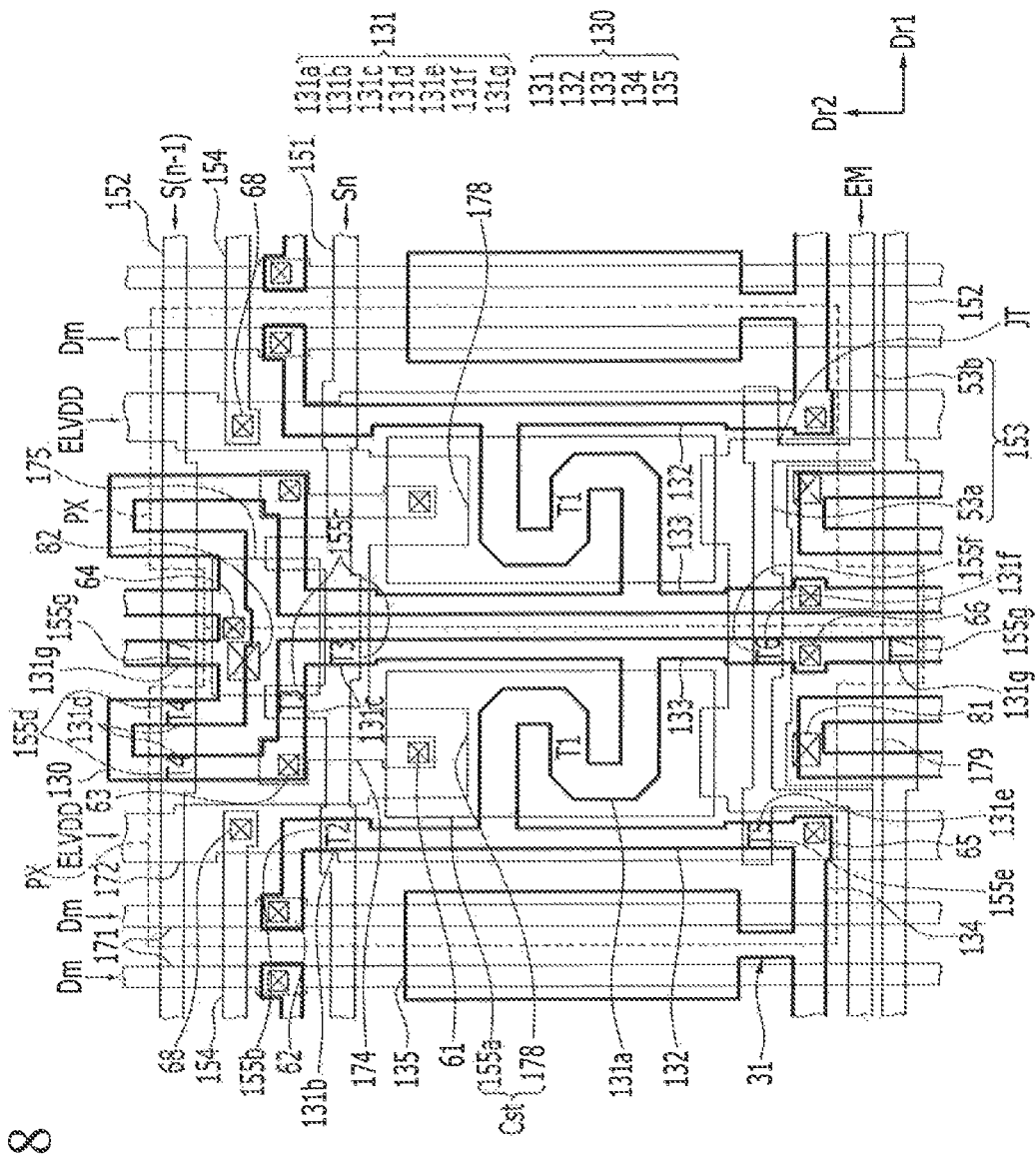
FIG. 8 to FIG. 10 are layout views illustrating adjacent pixels of a display device, according to an exemplary embodiment of the present invention.
Figure 9:
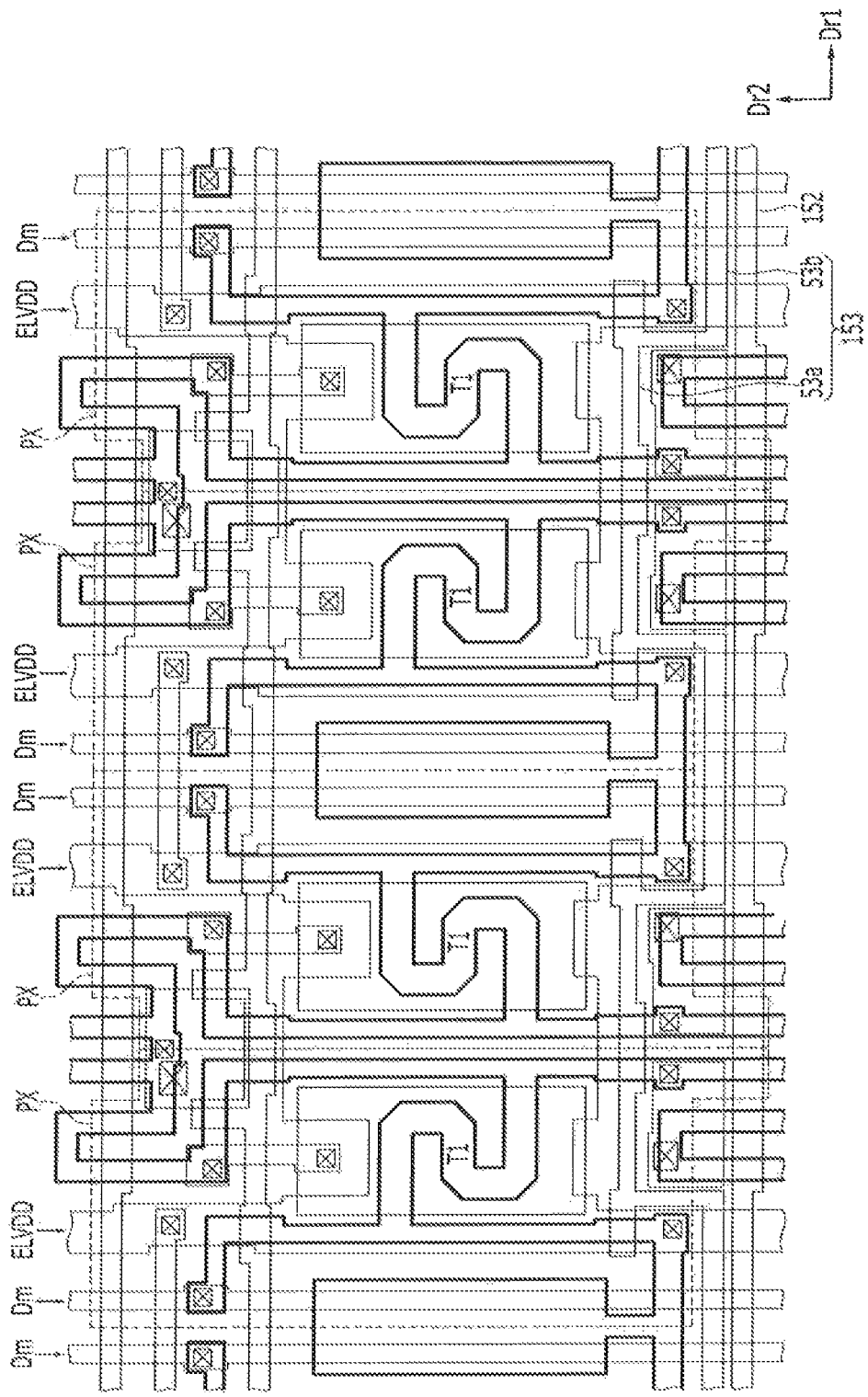

Referring to FIG. 8 and FIG. 9, the display device, according to an exemplary embodiment of the present invention, may be substantially similar to the display device described above, except for the plane shape of the channel region 131a of the first transistor T1. For example, the channel region 131a of the first transistor T1 may have an approximate "S" shape or a backwards "S" shape.

Other characteristics and elements of this display device may be similar to or the same as the above-described display devices.

Next, the display device, according to an exemplary embodiment of the present invention, will be described with reference to FIG. 10 along with the above-described drawings.

Figure 10:
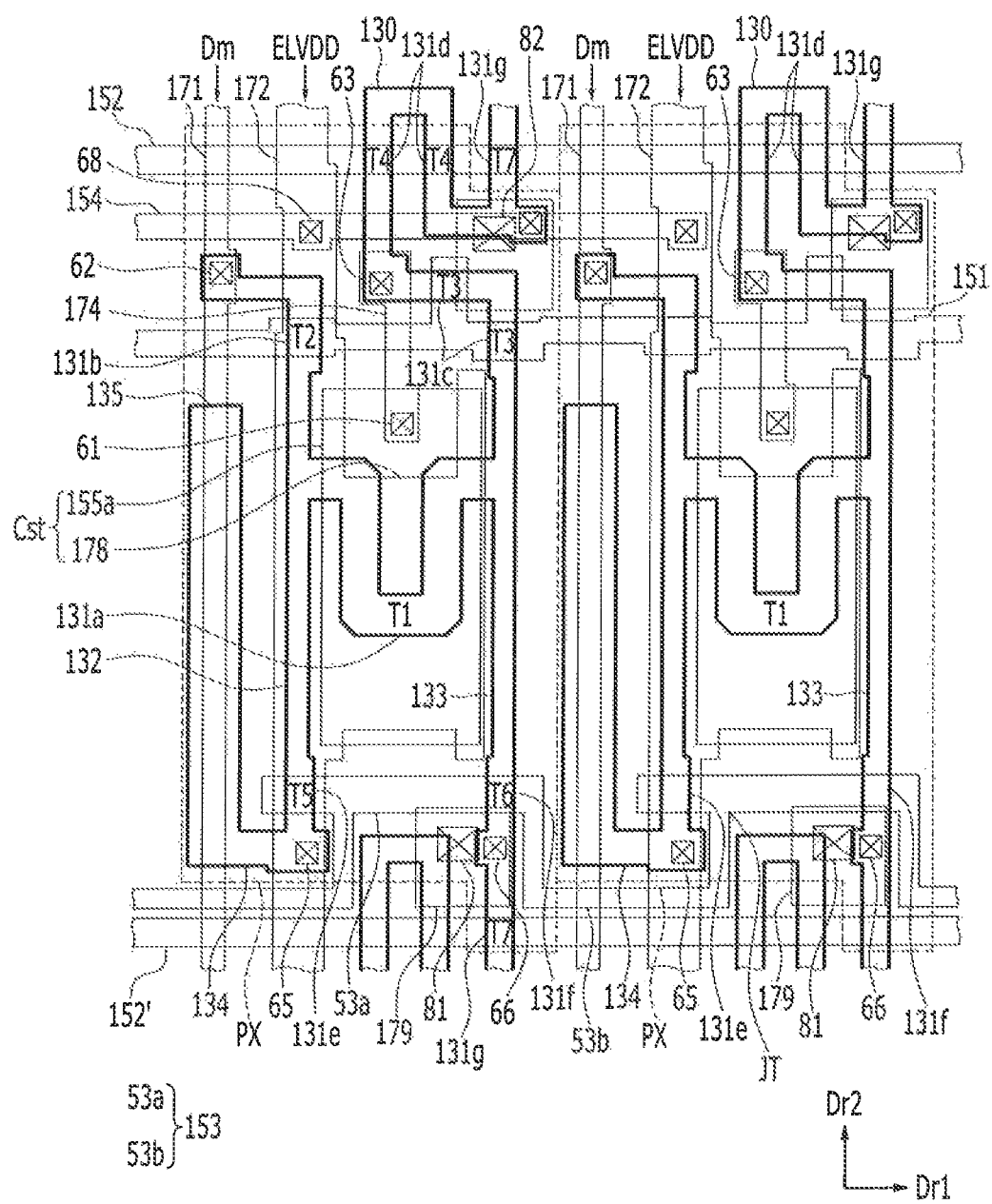

Referring to FIG. 10, the display device may be similar to or identical to the structures described above, except that two pixels PX adjacent in the first direction Dr1 do not form the symmetrical structure, but rather, may have the same shape. Accordingly, the expansion part 178 of the driving voltage line 172 disposed in one pixel PX may be disposed entirely within the region of the corresponding pixel PX. Also, the shielding part 135 of the active pattern 130 may overlap one data line 171 disposed between the two adjacent pixels PX.

The main line part 53a of the control line 153 is disposed one by one in one pixel PX, and the main line parts 53a disposed at the adjacent pixels PX may be separated from each other via one data line 171 and one shielding part 135. The detour part 53b connecting the adjacent main line parts 53a extends in a well shape from the connection position JT of the main line part 53a, extends in the second direction Dr2, and then is bent and extends in the first direction Dr1, crosses one data line 171, and is again bent in the second direction Dr2 to be connected to the main line part 53a of the adjacent pixel PX.

The main line part 53a of one pixel PX may include only the part extending around the data line 171 and disposed between the channel region 131e of the fifth transistor T5 or the channel region 131f of the sixth transistor T6 and the data line 171.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A display device, comprising:
a scan line extending in a first direction;
a plurality of data lines crossing the scan line;
a driving voltage line crossing the scan line;
an active pattern including a plurality of channel regions and a plurality of conductive regions; and
a control line crossing the plurality of data lines and the driving voltage line,
wherein the control line includes a plurality of main line parts each extending in the first direction, and a detour part connecting two adjacent main line parts of the plurality of main line parts to each other,
wherein the active pattern includes a shielding part overlapping at least one data line of the plurality of data lines, a longitudinal part crossing the plurality of main line parts, and a connection part connecting the longitudinal part to the shielding part, and
wherein the detour part extends along a periphery of the active pattern, crosses the at least one data line of the plurality of data lines, and does not overlap the shielding part.

2. The display device of claim 1, wherein an imaginary line extending from the plurality of main line parts crosses the shielding part.

3. The display device of claim 2, wherein the plurality of channel regions includes a first channel region overlapping the main line part, and the first channel region is disposed between a connection position where the detour part is connected to the main line part and an end of the main line part.

4. The display device of claim 3, wherein the detour part includes a first portion extending from the connection position in a second direction perpendicular to the first direction, and a second portion connected to the first portion and extending in the first direction, and the second portion crosses the at least one data line of the plurality of data lines.

5. The display device of claim 4, wherein the shielding part is connected to the driving voltage line.

6. The display device of claim 5, further comprising a driving gate electrode separated from the control line, and wherein the detour part is disposed at an opposite side of the imaginary line extending from the main line part with respect to the driving gate electrode.

7. The display device of claim 6, wherein the plurality of channel regions further include a second channel region connected to the longitudinal part and overlapping the driving gate electrode.

8. The display device of claim 6, wherein the driving gate is disposed between two adjacent data lines of the plurality of data lines, the driving voltage line includes an extension part extending in the first direction and overlapping the driving gate electrode to farm a capacitor, and the extension part is connected to the driving gate electrode.

9. The display device of claim 6, wherein the shielding part overlaps two adjacent data lines of the plurality of data lines.

10. The display device of claim 2, wherein the shielding part includes a recess portion that does not overlap the at least one data line, and wherein the recess portion is disposed on the imaginary extension line of the main line part.

11. A display device, comprising:
a plurality of pixels, wherein each pixel includes:
a light emitting diode;
a sixth transistor connected to the light emitting diode;
a control line including a gate electrode of the sixth transistor;
a data line crossing the control line; and
a shielding part overlapping the data line and receiving a driving voltage,
wherein the shielding part includes a recess portion that does not overlap the data line and an englarged portion connected to the recess portion and overlapping the data line,
wherein a width of the enlarged portion of the shielding part is greater than a width of the recess portion,
wherein the control line further includes a main line part that does not cross the data line, and
wherein the control line further includes a detour part connected to the main line part and bent along a periphery of the shielding part.

12. The display device of claim 11, further comprising:
a first transistor connected to the sixth transistor;
a fifth transistor connected between the first transistor and a driving voltage line transmitting the driving voltage; and
a seventh transistor connected between the sixth transistor and an initialization voltage line,
wherein the main line part further includes a gate electrode of the fifth transistor.

13. The display device of claim 12, wherein a terminal of the main line part is disposed between a channel region of the fifth transistor or the sixth transistor, and the data line.

14. The display device of claim 13, further comprising a scan line including a gate electrode of the seventh transistor, wherein the detour part includes a portion that is disposed between the main line part and the scan line.

15. The display device of claim 14, wherein the detour part has a well shape.

16. The display device of claim 15, wherein:
the shielding part is connected to a connection part extending in a different direction from that of the shielding part,
the connection part receives the driving voltage through a contact hole, and
the contact bole is disposed between a channel region of the fifth transistor and the detour part.

17. The display device of claim 16, further comprising a driving voltage line extending in parallel with the data line, wherein the driving voltage line is connected to the connection part through the contact hole, wherein the driving voltage line includes an extension part overlapping the gate electrode of the first transistor, and wherein the detour part includes a part extending in a direction opposite to that of the extension part with respect to the main line part.

18. The display device of claim 11, wherein the detour part is bent at least two times along a periphery of the shielding part.

19. The display device of claim 11, wherein the detour part crosses the data line of two adjacent pixels of the plurality of pixels.

* * * * *